(12) United States Patent
Anderson et al.

(10) Patent No.: US 8,470,682 B2
(45) Date of Patent: Jun. 25, 2013

(54) METHODS AND STRUCTURES FOR INCREASED THERMAL DISSIPATION OF THIN FILM RESISTORS

(75) Inventors: Brent A. Anderson, Jericho, VT (US); Jed H. Rankin, Richmond, VT (US); Robert R. Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 12/968,001

(22) Filed: Dec. 14, 2010

(65) Prior Publication Data

US 2012/0146187 A1 Jun. 14, 2012

(51) Int. Cl.
*H01L 21/20* (2006.01)

(52) U.S. Cl.
USPC ............... 438/384; 257/E21.004; 438/382

(58) Field of Classification Search
USPC ............... 438/381–384; 257/E21.004, 528, 257/536–538
See application file for complete search history.

(56) References Cited

U.S. PATENT DOCUMENTS

| | | | |
|---|---|---|---|
| 4,939,104 A | 7/1990 | Pollack et al. | |
| 5,352,923 A * | 10/1994 | Boyd et al. | 257/536 |
| 5,364,800 A | 11/1994 | Joyner | |
| 5,889,293 A | 3/1999 | Rutten et al. | |
| 5,955,781 A | 9/1999 | Joshi et al. | |
| 6,069,398 A * | 5/2000 | Kadosh et al. | 257/538 |
| 6,121,661 A | 9/2000 | Assaderaghi et al. | |
| 6,180,487 B1 | 1/2001 | Lin | |
| 6,228,691 B1 | 5/2001 | Doyle | |
| 6,288,426 B1 | 9/2001 | Gauthier, Jr. et al. | |
| 6,414,355 B1 | 7/2002 | An et al. | |
| 6,515,333 B1 | 2/2003 | Riccobene | |
| 6,531,741 B1 | 3/2003 | Hargrove et al. | |
| 6,673,635 B1 | 1/2004 | Hellig et al. | |
| 6,700,474 B1 * | 3/2004 | Leibiger | 338/309 |
| 7,078,305 B2 * | 7/2006 | Olson | 438/382 |
| 2007/0087514 A1 | 4/2007 | Hamamoto | |

* cited by examiner

*Primary Examiner* — Leonard Chang
(74) *Attorney, Agent, or Firm* — David Cain; Roberts Mlotkowski Safran & Cole, P.C.

(57) ABSTRACT

A method of forming a semiconductor structure includes forming at least one trench in an insulator layer formed on a substrate. A distance between a bottom edge of the at least one trench and a top surface of a substrate is shorter than a distance between an uppermost surface of the insulator layer and the top surface of the substrate. The method also includes: forming a resistor on the insulator layer and extending into the at least one trench; forming a first contact in contact with the resistor; and forming a second contact in contact with the resistor such that current is configured to flow from the first contact to the second contact through a central portion of the resistor.

16 Claims, 10 Drawing Sheets

METHODS AND STRUCTURES FOR INCREASED THERMAL DISSIPATION OF THIN FILM RESISTORS

FIELD OF THE INVENTION

The invention relates to semiconductor structures and methods of manufacture and, more particularly, to thin film resistors for increased thermal dissipation and methods of manufacture.

BACKGROUND

Precision thin film resistors are in general use in Si-based microelectronics integrated circuit chips. These resistors are frequently fabricated from polysilicon layers deposited on the chip. The resistor material is generally high in electrical resistivity, and the total resistance is controlled by the film thickness and the width and length of the rectangular film segment that is used. The resistance is given by $R=\rho*l/A$, where rho is the electrical resistivity, l is the length (direction parallel to the current flow) of the rectangle, and A is the cross-sectional area (thickness times width). The resistivity of Si resistors can be tailored by implantation of dopants, which increase the conductivity.

However, silicon on insulator (SOI) wafers, low dielectric constant (e.g., low k) Back-End-Of-Line (BEOL) films, groundrule scaling, and thinner films are resulting in increased challenges in preventing overheating of semiconductors. Resistors produce heat when current flows through them and the effects of this heat on the performance of the resistors, and the nearby transistors are particularly problematic. Particularly, problems arise because resistors are being sandwiched between two insulative layers: a buried oxide (BOX) layer and BEOL films. In addition, the thickness of Si or polysilicon resistors is being reduced generationally, and resistor dimensions are limited by internal heating.

Simulations have shown that current Si resistors can heat up by as much as 10° C., which results in a 5% variation in the resistivity of the Si resistor. The generated heat can permanently alter the value of the resistance by changing the grain size of the polysilicon, by burning out portions (or all) of the film and by redistributing the dopant atoms. Due to these effects, it's necessary to limit the amount of current that the resistor can tolerate. In addition to effects on the resistor itself, the generated heat may be conducted into the metal lines that are connected to the resistor and also into metal lines that may be located immediately above the resistor. Heating of the attached and nearby metal structures increases the susceptibility of the metal to electromigration, a process that produces holes in the metallization in response to current flow and can eventually alter the electrical properties of the wire. Consequently, limiting the current through the resistor protects both the resistor stability and the integrity of the nearby metallization.

However, limiting the current through a resistor is at odds with the continued drive toward circuit miniaturization and the trend toward progressively greater current densities for high-performance circuits. That is, the heating constraint on resistor current is contending with circuit miniaturization and with circuit power requirements.

Accordingly, there exists a need in the art to overcome the deficiencies and limitations described hereinabove.

SUMMARY

In a first aspect of the invention, there is a method of forming a semiconductor structure. The method includes forming at least one trench in an insulator layer formed on a substrate. A distance between a bottom edge of the at least one trench and a top surface of a substrate is shorter than a distance between an uppermost surface of the insulator layer and the top surface of the substrate. The method also includes: forming a resistor on the insulator layer and extending into the at least one trench; forming a first contact in contact with the resistor; and forming a second contact in contact with the resistor such that current is configured to flow from the first contact to the second contact through a central portion of the resistor.

In another aspect of the invention, there is a method of fabricating a semiconductor structure comprising: forming a plurality of divots in an insulator layer formed on a substrate; forming a resistor on the insulator layer and filling the plurality of divots; and forming another insulator layer over the resistor. The method also includes: forming a first contact in the other insulator layer and contacting a first end of the resistor; and forming a second contact in the other insulator layer and contacting a second end of the resistor such that current is configured to flow from the first contact to the second contact through a central portion of the resistor. The method also includes sizing the plurality of divots in a top surface of the insulator layer such that a top surface of the resistor is substantially planar.

In yet another aspect of the invention, there is a semiconductor structure comprising a substrate. The semiconductor structure further comprises an insulator layer over the substrate. The semiconductor structure further comprises at least one trench in the insulator layer. The semiconductor structure further comprises a resistor over the insulator layer. The semiconductor structure further comprises at least one first contact in contact with the resistor. The semiconductor structure further comprises at least one second contact in contact with the resistor. The resistor is structured and arranged such that current is configured to flow from the at least one first contact to the at least one second contact through a central portion of the resistor. The resistor comprises at least one extension extending into the at least one trench. A distance between a bottom edge of the at least one extension and a top surface of the substrate is shorter than a distance between an uppermost surface of the insulator layer and the top surface of the substrate.

In another aspect of the invention, there is a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a resistor, which comprises the structures of the present invention. In still further embodiments, a method in a computer-aided design system is provided for generating a functional design model of the resistor. The method comprises generating a functional representation of the structural elements of the resistor.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to thin film resistors for increased thermal dissipation and methods of manufacture. In accordance with aspects of the invention, a resistor includes a portion that extends downward into an underlying insulator layer. In embodiments, the varied topography of the resistor caused by the extension portion provides an increased thermal dissipation area of the resistor. The varied topography also decreases a thickness of the backside isolation material (e.g., the underlying insulating layer) to minimize thermal isolation of the resistor from the substrate while maintaining electrical isolation of the resistor from the substrate. The insulator is designed at this thickness to enhance ease of manufacture, and to help in noise-isolation from active devices using A.C. (alternating current). Resistors, by contrast, use D.C. (direct current), and are therefore not impacted significantly by additional capacitance to the substrate.

In embodiments, the resistor includes a substantially planar top surface and a plurality of extensions that fill divots in the insulating layer. A thermally conductive spacer may be formed on the sidewalls of the divots to provide for self-alignment of the extensions in the divots. In embodiments, a top surface of the resistor may comprise varied topography such that the top surface is non-planar. The varied topography in the top surface of the resistor allows for a linear conduction length of the resistor to be increased while maintaining or decreasing the overall size of the resistor. In this manner, implementations of the invention may be used to provide a precision thin film resistor having enhanced thermal dissipation, and consequently the ability to reduce the temperature of the resistor quicker, which additionally is contained in a smaller linear space than a corresponding resistor formed by conventional means.

Resistive heating is a physical consequence of electric current passing through the material of a resistor. Implementations of the invention reduce the temperature of a resistor by reducing the thermal resistance of the resistor, which causes heat to conduct away from a resistor faster than is presently done in conventional resistors. The thermal resistance of a specific resistor is determined by the thermal conductivity of the materials in contact with the resistor and the substrate Si (which acts as the thermal reservoir), and by the thickness (e.g., vertical height) and lateral dimensions (e.g., length and width). As such, resistance is influenced by both a materials component and a geometric component.

Polysilicon resistors typically reside on an insulator layer (e.g., $SiO_2$ or similar material) above an Si substrate. Heat in the resistor spreads by thermal conduction into the surrounding oxide and from the oxide into the Si substrate. Heat generated during resistive heating may flow directly down through the oxide between the resistor and the substrate. The heat may also flow out of the top and the side edges of the resistor. As such, there are top, side, and bottom heat conduction paths from the resistor.

Thermal resistance depends on the geometry of the resistor and the surrounding oxide. For current generation silicon devices, where low-k back end dielectric material is used, the side and top conduction paths contribute relatively little heat conduction, and nearly all of the heat flows out through the bottom path (e.g., through the bottom surface of the resistor into adjacent insulator). In such cases, the thermal resistance can be approximated by $R_{th}=(ti/ki)/A$, where A is the area of the resistor, ti is the thickness of the insulator between the resistor and the substrate, and ki is the thermal conductivity of the insulator. Accordingly, by increasing the area of the resistor and decreasing the thickness of the insulator between the resistor and the substrate (e.g., increasing the thermal flow), a reduction in thermal resistance of the resistor can be achieved. Consequently, the reduction in thermal resistance allows for the avoidance of unwanted temperature increases.

Figure 1:
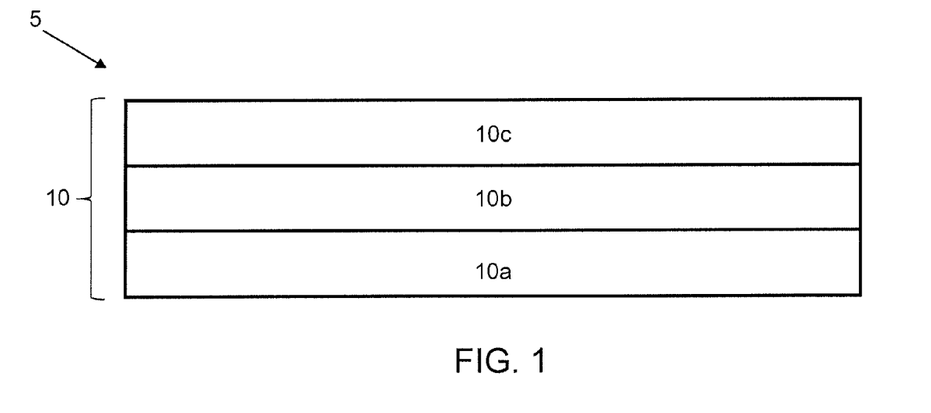
FIGS. 1, 2, 3a, 3b, 4, and 5 show processing steps and structures in accordance with aspects of the present invention.

FIGS. 1-5 show processing steps and structures in accordance with aspects of the invention. Specifically, FIG. 1 shows an exemplary beginning structure 5 comprising a SOI wafer 10 employed in implementations of the invention. The SOI wafer 10 has a bulk semiconductor substrate 10a, which is typically a silicon substrate, a buried insulator layer 10b formed on the substrate 10a, and a semiconductor layer 10c, which is typically a silicon layer, formed on the buried insulator layer 10b. The SOI wafer 10 may be fabricated using techniques well know to those skilled in the art. For example, the SOI wafer 10 may be formed by conventional processes including, but not limited to, oxygen implantation (e.g., SIMOX), wafer bonding, etc.

The constituent materials of the SOI wafer 10 may be selected based on the desired end use application of the semiconductor device. For example, the substrate 10a may be composed of any suitable material including, but not limited to, Si, SiGe, SiGeC, SiC, GE alloys, GaAs, InAs, InP, and other III/V or II/VI compound semiconductors. The buried insulator layer 10b may be composed of oxide, such as $SiO_2$, and may be referred to as BOX layer 10b. Moreover, although the SOI wafer is referred to as "silicon on insulator," the semiconductor layer 10c is not limited to silicon. Instead, the semiconductor layer 10c may be comprised of various semiconductor materials, such as, for example, Si, SiGe, SiC, SiGeC, etc.

In embodiments, the SOI wafer 10 has a thickness of about 1000 μm, with the semiconductor layer 10c having a thickness of about 0.06 μm and the BOX layer 10b having a thickness of about 0.1 μm. However, the invention is not limited to these dimensions, and the various portions of the SOI wafer may have any desired thicknesses based upon the intended use of the final semiconductor device.

Figure 2:
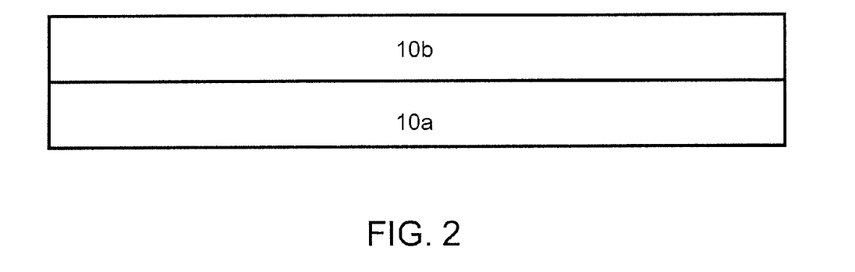

FIG. 2 shows a portion of the wafer after selective removal of a portion of the semiconductor layer 10c to expose a portion of the BOX layer 10b on which the resistor will be formed. Although not shown for clarity, other portions of the semiconductor layer 10c are still present on the wafer and may be isolated from the region shown in FIG. 2 by suitable isolation structures. The portion of the semiconductor layer 10c may be removed using conventional semiconductor fabrication techniques, such as etching the semiconductor layer 10c through a mask, which may be a hard mask or a photoresist. For example, the mask may be formed by applying a photoresist material on the semiconductor layer 10c and exposing and developing the photoresist material to form a pattern on the semiconductor layer 10c. An etch process comprising a directional etch having a chemistry that selectively removes material of the semiconductor layer 10c may be performed to remove a portion of the semiconductor layer 10c that is not protected by the mask. In particular, the patterning selectively removes a portion of the semiconductor layer 10c in order to expose a portion of a surface of the BOX layer 10b. The etch process may comprise a reactive ion etch (RIE), for example.

Figure 3A:
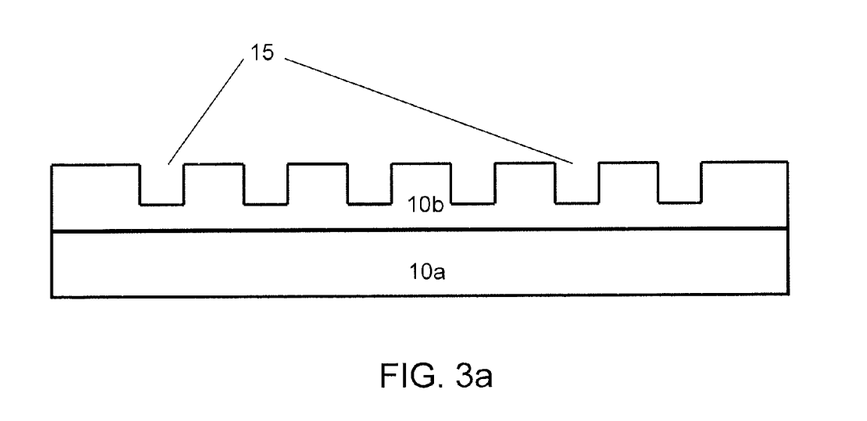

FIG. 3a shows the formation of divots 15 (e.g., shallow trenches) in the surface of the exposed surface of the BOX layer 10b. The divots 15 may be formed using conventional semiconductor fabrication techniques, such as etching the BOX layer 10b through a mask e.g., in a manner similar to that described above with regard to etching the semiconductor layer 10c. In embodiments, the divots 15 do not extend through the entirety of the thickness of the BOX layer 10b. Instead, the divots 15 extend partially into the BOX layer 10b to provide electrical isolation from the substrate 10a.

Figure 3B:
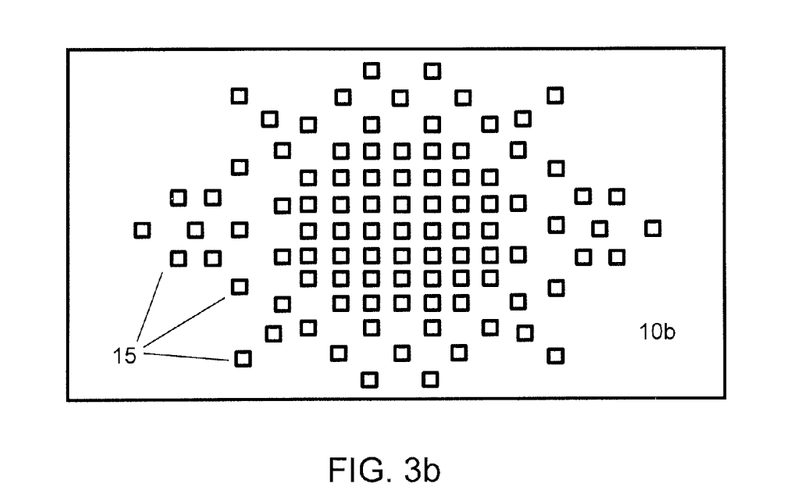

In accordance with aspects of the invention, the arrangement (e.g., size, spatial location, etc.) of the divots 15 in the exposed surface of the BOX layer 10b may be varied depending on the mask pattern. As described in greater detail herein, a thin-film resistor will be formed on the BOX layer 10b which will extend into the divots 15. A hottest point of such a resistor may be a middle portion of the resistor as compared to edges of the resistor. For this reason, it may be desirable to use a mask pattern such that a photoresist material is applied on the exposed surface of the BOX layer 10b in the pattern of a starburst, which forms a plurality of divots 15 in the starburst pattern as shown in FIG. 3b. Therefore, when the exposed layer of the BOX layer 10b is etched through the photoresist material, the divots 15 are formed tightly concentrated in a center of the exposed surface of the BOX layer 10b and sporadically (e.g., less densely) concentrated towards edges of the exposed surface of the BOX layer 10b. Accordingly, in embodiments, placement of the divots 15 corresponds to the hottest spot (e.g., the middle portion) on the resistor. However, many modifications and variations of the pattern of the divots 15 will be apparent to those of ordinary skill in the art without departing from the scope and spirit of the invention.

Furthermore, a shape of the divots 15 may be varied depending on the fabrication technique. For example, an etch process comprising an isotropic directional etch may be used to form rectangular shaped divots 15. This etch process may comprise an RIE, for example. Alternatively, an etch process comprising an anisotropic wet bath may be used to form hemispherical shaped divots 15. This etch process may comprise a hydrochloric wet bath, for example. Many modifications and variations of the shape of the divots 15 will be apparent to those of ordinary skill in the art without departing from the scope and spirit of the invention.

Figure 4:
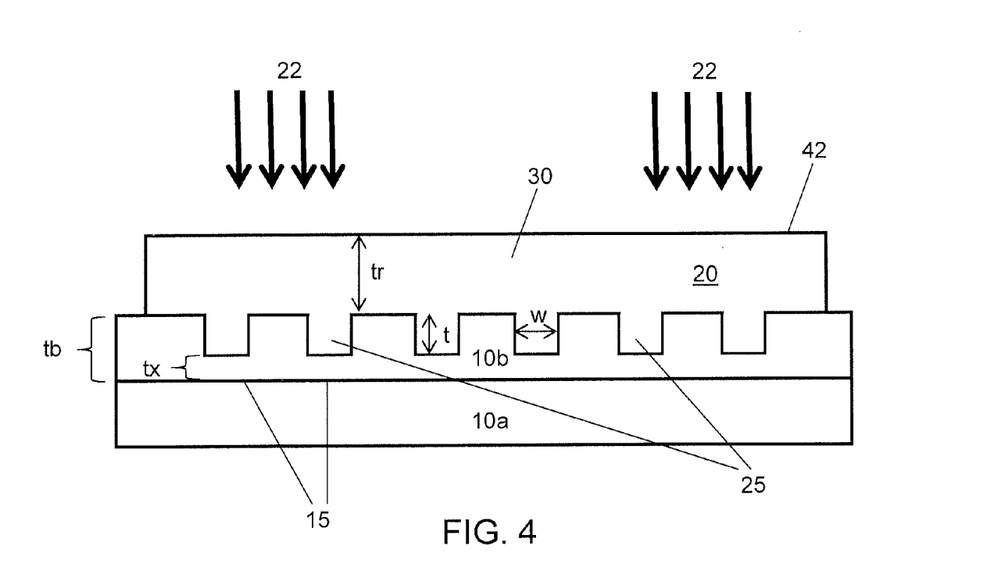

FIG. 4 shows a resistor 20 formed on the exposed surface of the BOX layer 10b. In embodiments, the resistor 20 is formed using conventional semiconductor processing techniques. For example, the resistor 20 may comprise electrically conductive doped polysilicon. Specifically, the resistor 20 may be formed by depositing polysilicon using a chemical vapor deposition (CVD) process, plasma-enhanced chemical vapor deposition (PECVD), or any other suitable deposition process. Following deposition, the polysilicon may be patterned (e.g., masked and etched) to define the resistor 20. The doping process of the resistor 20 may be performed using conventional techniques for doping polysilicon. For example, the resistor 20 may be doped in-situ such that dopants are introduced to the polysilicon at the same time as the deposition of the polysilicon layer. Alternatively, the resistor 20 may be doped by ion implantation, shown by arrows 22, such that dopants are implanted into the polysilicon layer by directly bombarding the polysilicon with high-energy ions of any suitable dopant species after deposition of the polysilicon layer.

As depicted in FIG. 4, the resistor 20 includes extensions 25 that extend downward (e.g., vertically) into the divots 15 of the BOX layer 10b. The extensions 25 may be comprised of a same material as the resistor 20. In embodiments, the extensions 25 provide an increased surface area for the resistor 20 that is outside of the central resistor portion 30 where current flows during operation of the resistor. Consequently, a heat path from the resistor 20 to the substrate 10a through the BOX layer 10b is shorter because the thickness "tx" of the BOX layer 10b is decreased at portions of the BOX layer 10b below the extensions 25 as compared to the overall thickness "tb" of the BOX layer 10b. Thus, heat is capable of dissipating from the central portion 30 of the resistor 20 to the substrate 10a quicker along the shorter path (e.g., through reduced thickness "tx" of the BOX layer 10b as compared to the full thickness "tb" of the BOX layer 10c).

Moreover, in accordance with aspects of the invention, the size, shape, and spatial arrangement of the divots 15 and consequently the extensions 25 may be tailored based on a desired surface area for the resistor 20 and a desired thickness "tx" of the BOX layer 10b. For example, at least one of the size, shape, and spatial arrangement of the divots 15 may be selected to optimize a heat transfer profile from the resistor 20 to the substrate 10a, e.g., in a manner similar to the starburst pattern already described with regard to FIG. 3b.

In accordance with aspects of the invention, the divots 15 are sized and shaped such that the resultant topography of the top surface of the BOX layer 10b does not impact the overall planarity of the resistor 20 formed over the top surface 42 of the BOX layer 10b. In particular, as depicted in FIG. 4, the divots 15 are sized and shaped such that the deposition process for forming the resistor 20 produces a substantially planar top surface 42.

For example, in embodiments, the divots 15 are formed such that the resultant extensions 25 have a width "w" of about 0.05 µm and a thickness "t" measured from the exposed surface of the BOX layer 10b of about 0.09 µm, depending on the design of the overall structure. This results in a thickness "tx" of about 0.01 µm. The divots 15 and the resistor 20 are not limited to these dimensions, however, and any suitable dimensions may be used within the scope of the invention. In embodiments, the width "w" of the extensions 25 is less than half the thickness "tr" of the resistor 20 to ensure the planarity of the top surface 42 from the deposition process. In a particular embodiment, the thickness "tr" of the resistor 20 is about 1000 Å, and the width "w" of the extensions 25 is less than about 500 Å.

Advantageously, the increased surface area of the resistor 20 caused by the extensions 25 and the shorter heat path to the substrate 10a caused by the decreased thickness "tx" of the BOX layer 10b effectively lowers the thermal resistance of the resistor 20. Consequently, the reduction in thermal resistance allows for the temperature of the resistor 20 to be decreased quicker.

Figure 5:
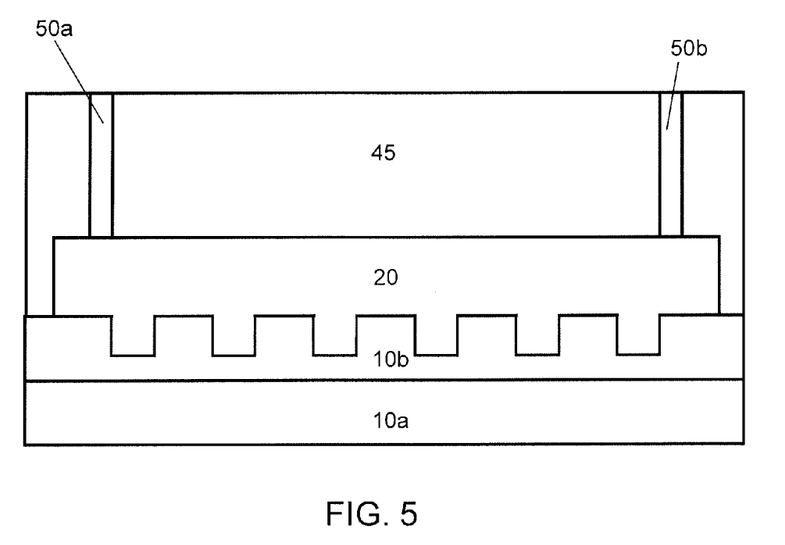

FIG. 5 shows the formation of an insulator layer 45 over the BOX layer 10b and the resistor 20. The insulator layer 45 may be silicon dioxide ($SiO_2$) or any other suitable insulator material. The insulator layer 45 may be formed in any conventional manner, such as CVD or thermal oxidation.

FIG. 5 also shows the formation of contacts 50a and 50b in the insulator layer 45. In embodiments, the contacts 50a and 50b are formed in any conventional manner. For example, trenches may be formed in the insulator layer 45 by masking the structure and performing a directional etch having a chemistry that selectively removes exposed portions of the insulator layer 45 that are not protected by the mask. The contacts 50a and 50b may then be formed by depositing (e.g., using CVD) tungsten or any other desired electrically conductive material in the trenches. In embodiments, the contacts 50a and 50b may be in the form of a single via, a plurality of vias (e.g., an array of small pillars with a minimum diameter dependent on the technology, for example 0.25 μm in diameter), or in the form of a solid bar.

Figure 6:
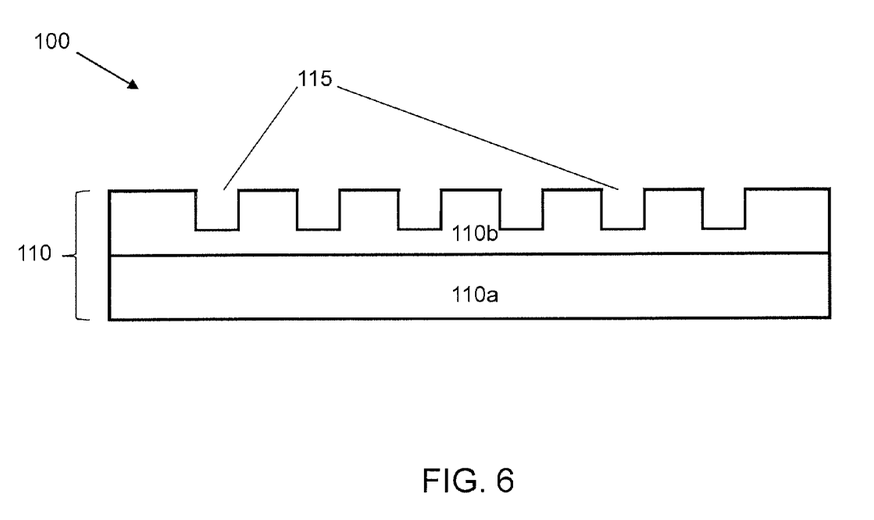
FIGS. 6-9 show processing steps and structures in accordance with additional aspects of the present invention.

FIGS. 6-9 show processing steps and resultant structures in accordance additional aspects of the invention. Specifically, FIG. 6 shows an exemplary structure 100 comprising a SOI wafer 110 that has already undergone the processes described above with regard to FIGS. 2 and 3a. In particular, the SOI wafer 110 in FIG. 6 is similar to that described above with respect to FIG. 3a in that the SOI wafer 110 comprises a substrate 110a, BOX layer 110b and a semiconductor layer (not shown) with a portion selectively removed, and divots 115 formed in the BOX layer 110b. In the embodiment shown in FIG. 6, the divots 115 are formed in the exposed surface of the BOX layer 110b using an etch process comprising an isotropic directional etch such that the divots 115 are formed with a rectangular or square shape.

Figure 7:
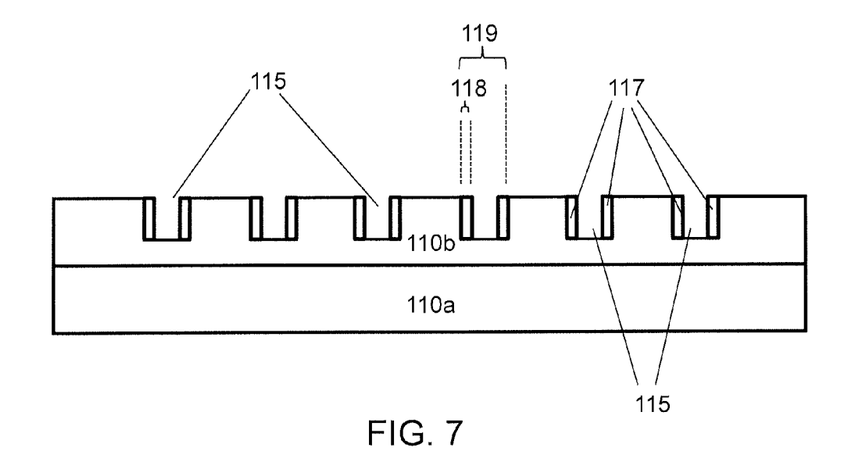

FIG. 7 shows the formation of a liner 117 on inner surfaces of the divots 115. The liner 117 may be formed of a conformal film using conventional semiconductor processing steps. For example, the liner 117 may comprise a high thermal conductivity material, such as hafnium oxide. The liner 117 may be formed by using a deposition process, such as CVD, to deposit the high thermal conductivity material. More specifically, the divots 115 are first completely lined with the high thermal conductivity material, and subsequently a portion of the deposited high thermal conductivity material is removed (e.g., etched) from the horizontal surfaces, including the bottom of the divots 115. In this way, the liner 117 is formed of a film of the high thermal conductivity material that remains on the sidewalls of the inner surfaces of the divots 115. The invention is not limited to the use of hafnium oxide, and the liner 117 may be composed of other materials including but not limited to: graphene, diamond, or other metallic compounds. Furthermore, although CVD is described for depositing the high thermal conductivity material in the divots 115 to form the liner 117, the liner 117 may be formed by any suitable process such as, for example: spin on coating, sputter deposition, or ALD (atomic layer deposition)

Moreover, in accordance with aspects of the invention, a remaining overall thickness 118 of the liner 117 may be tailored such that the liner 117 comprises about 33% of a total width 119 of the divots 115. In a particular embodiment, the divots 115 have a width 119 of about 500 Å, and the thickness 118 of the liner 117 is about 165 Å. Advantageously, the liner 117 increases the thermal conductivity of the divots 115 because the liner 117 is formed of a material (e.g., high thermal conductivity material) that has an ability to conduct heat greater than the surrounding BOX layer 110b. Consequently, the thermal resistivity of the resistor is effectively lowered.

Figure 8:
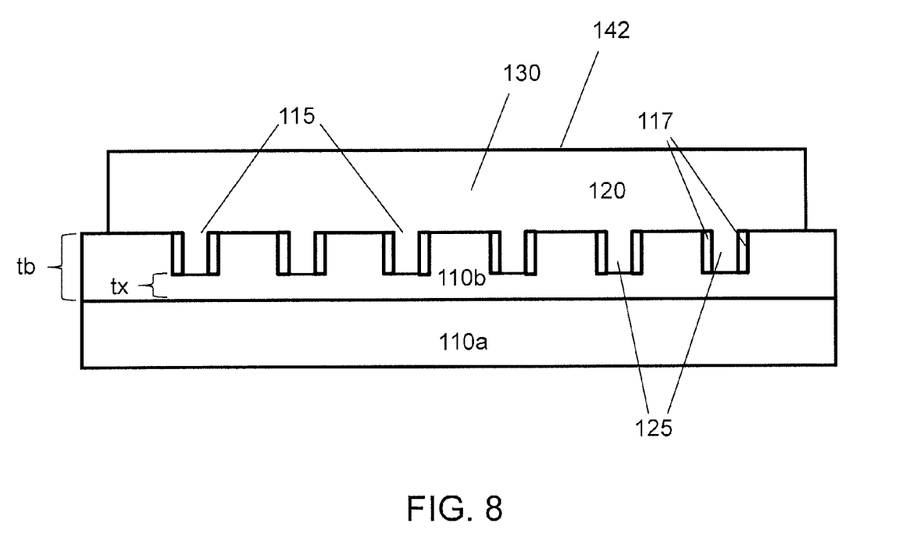

FIG. 8 shows the formation of a resistor 120 on the exposed surface of the BOX layer 110b. The resistor 120 may be formed in a similar manner and composed of similar materials as resistor 20 described with respect to FIG. 2, e.g., by conformal deposition of a polysilicon film and subsequent patterning of the film to the define the resistor 120.

As depicted in FIG. 8, the resistor 120 includes extensions 125 that extend downward (e.g., vertically) into the divots 115 of the BOX layer 110b within the liner 117. As discussed above, in embodiments, the extensions 125 provide an increased surface area for the resistor 120 that is outside of the central resistor portion 130. Consequently, a heat path from the resistor 120 to the substrate 110a through the BOX layer 110b is shorter because the thickness "tx" of the BOX layer 110b is decreased at portions of the BOX layer 110b below the extensions 125 as compared to the overall thickness "tb" of the BOX layer 110b. Thus, heat is capable of dissipating from the central portion 130 of the resistor 120 to the substrate 110a quicker along this shorter path through the BOX layer 110b.

In accordance with aspects of the invention, the divots 115 are sized and shaped such that the resultant topography of the top surface 142 of the BOX layer 110b does not impact the overall planarity of the resistor 120 formed over the top surface of the BOX layer 110b. In particular, as depicted in FIG. 8, the divots 115 are sized and shaped such that the deposition process for forming the resistor 120 produces a substantially planar top surface 142.

Advantageously, the thermal resistance of the resistor 120 can be effectively lowered using the processes of the present invention. This is due to the increased surface area of the resistor 120 caused by the extensions 125, the shorter heat path to the substrate 110a caused by the decreased thickness "tx" of the BOX layer 110b, and the increased thermal conductivity caused by the liner 117. Consequently, the reduction in thermal resistance allows for the temperature of the resistor 120 to be maintained better.

Figure 9:
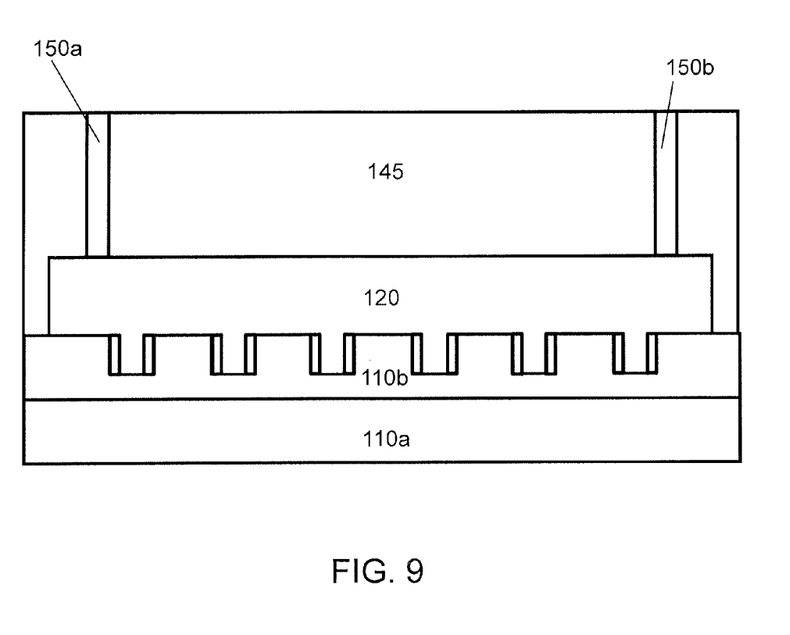

FIG. 9 shows the formation of an insulator layer 145 over the BOX layer 110b and the resistor 120, and the formation of contacts 150a and 150b in the insulator layer 145. The insulator layer 145 and the contacts 150a and 150b may be fabricated in a manner similar to the insulator layer 45 and the contacts 50a and 50b.

Figure 10:
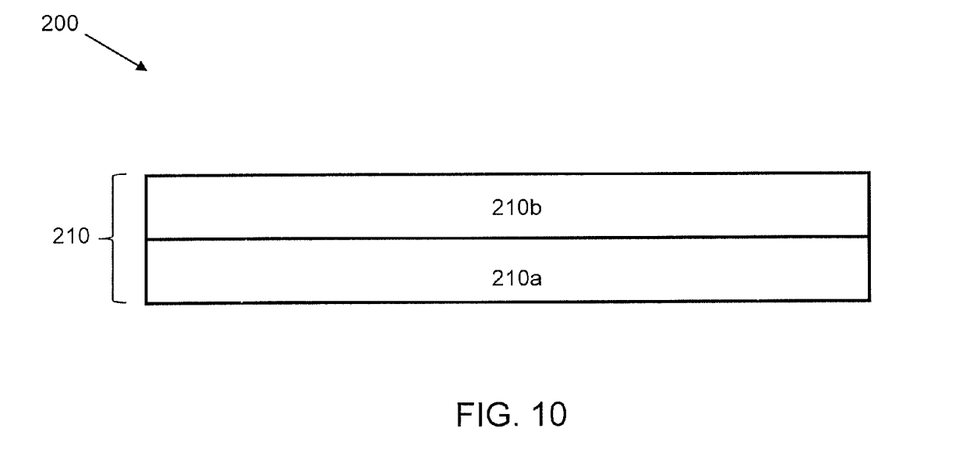
FIGS. 10-13 show processing steps and structures in accordance with additional aspects of the present invention.

FIGS. 10-13 show processing steps and resultant structures in accordance with additional aspects of the invention. Specifically, FIG. 10 shows an exemplary structure 200 comprising a SOI wafer 210 that has already undergone the processes described above with regard to FIG. 2. In particular, the SOI wafer 210 in FIG. 10 comprises a substrate 210a, a BOX layer 210b and a semiconductor layer (not shown) with a portion selectively removed.

Figure 11:
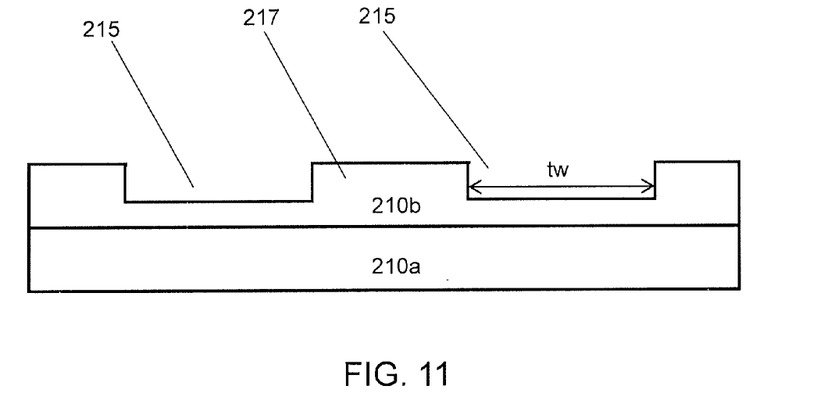

FIG. 11 shows the formation of trenches 215 and an island 217 on the exposed surface of the BOX layer 210b. The trenches 215 and the island 217 may be formed using conventional semiconductor fabrication techniques, such as etching the BOX layer 210b through a mask, as discussed above with regard to the divots 15 and the BOX layer 10b. Although the trenches 215 may be formed in a manner similar to divots 15, the trenches 215 are wider than the divots 215. More specifically, in embodiments, the trenches 215 are formed with a width "tw" that causes a subsequently conformally deposited resistor film to have a varied topography on its top surface as described in greater detail below. Many modifications and variations of the trenches 215 and the island 217 will be apparent to those of ordinary skill in the art without departing from the scope and spirit of the invention.

Figure 12:
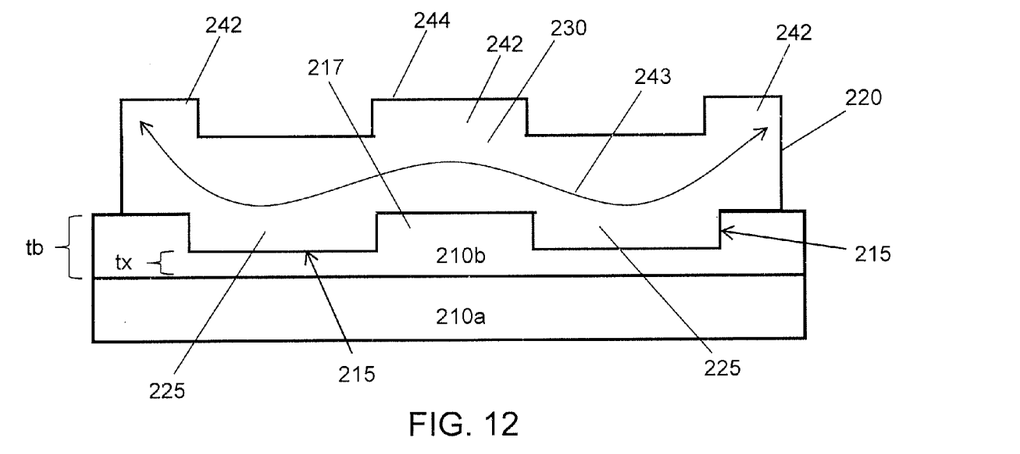

FIG. 12 shows a resistor 220 formed on the exposed surface of the BOX layer 210b. The resistor 220 may be formed in a similar manner as resistor 20 described with respect to FIG. 2, e.g., by conformal deposition of a polysilicon film and subsequent patterning of the film to define the resistor 220.

As depicted in FIG. 12, the resistor 220 includes extensions 225 that extend downward (e.g., vertically) into the trenches 215 of the BOX layer 210b. As discussed above, in embodiments, the extensions 225 provide an increased surface area for the resistor 220 that is outside of the central resistor portion 230. Consequently, a heat path from the resistor 220 to the substrate 210a through the BOX layer 210b is shorter because the thickness "tx" of the BOX layer 210b is decreased at portions of the BOX layer 210b below the extensions 225, as compared to the overall thickness "tb" of the BOX layer 210b. Thus, heat is capable of dissipating from the central portion 230 of the resistor 220 to the substrate 210a quicker along the shorter path.

In accordance with aspects of the invention, the width "tw" of the trenches 215 in combination with the island 217 cause the formation of additional topographic structures 242 in the resistor 220, which effectively increases an overall linear length 243 (e.g., conductive length) of the resistor 220. Specifically, in embodiments, the resistor 220 is conformally deposited on the BOX layer 210b such that the topographic structures 242 are formed in a top surface 244 of the resistor 220 and the topographic structures 242 correspond to the trenches 215 and the island 217. The increased linear length 243 permits the use of a smaller footprint (e.g., smaller area in plan view) for the resistor 220. Further, the topographic structures 242 impact the overall planarity of the resistor 220 formed over the top surface of the BOX layer 210b. In particular, a top surface 244 of the resistor 220 is caused to be non-planar.

Advantageously, the thermal resistance of the resistor 220 can be effectively lowered using the processes of the present invention. This is due to the increased surface area of the resistor 220 caused by the extensions 225, the shorter heat path to the substrate 220a caused by the decreased thickness "tx" of the BOX layer 210b and the increased resistor length 243 caused by the island 217, and topographic structures 242. Consequently, the reduction in thermal resistance allows for the temperature of the resistor 220 to be decreased quicker.

Figure 13:
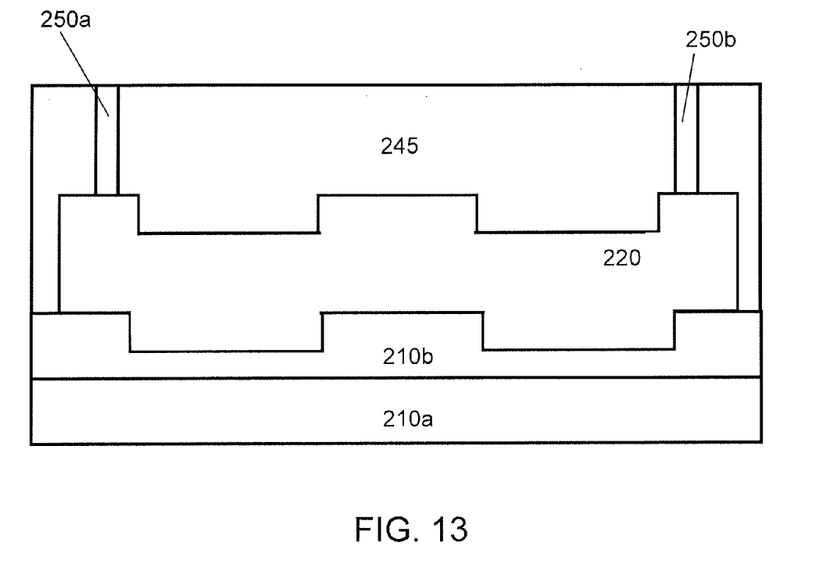

FIG. 13 shows the formation of an insulator layer 245 over the BOX layer 210b and the resistor 220, and the formation of contacts 250a and 250b in the insulator layer 245. The insulator layer 245 and the contacts 250a and 250b may be formed in a similar manner and composed of similar materials as the insulator layer 45 and the contacts 50a and 50b described above with regard to FIG. 5.

Figure 14:
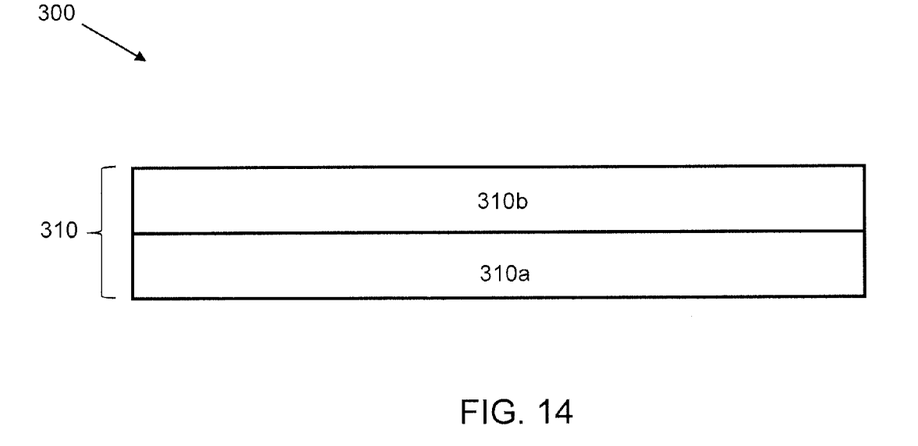
FIG. 14-17 show processing steps and structures in accordance with additional aspects of the present invention.

FIGS. 14-17 show processing steps and resultant structures in accordance with additional aspects of the invention. Specifically, FIG. 14 shows an exemplary structure 300 comprising a SOI wafer 310 that has undergone the processes described above with regard to FIG. 2. In particular, the SOI wafer 310 comprises a substrate 310a, a BOX layer 310b and a semiconductor layer (not shown) with a portion selectively removed to expose a portion of the BOX layer 310b.

Figure 15:
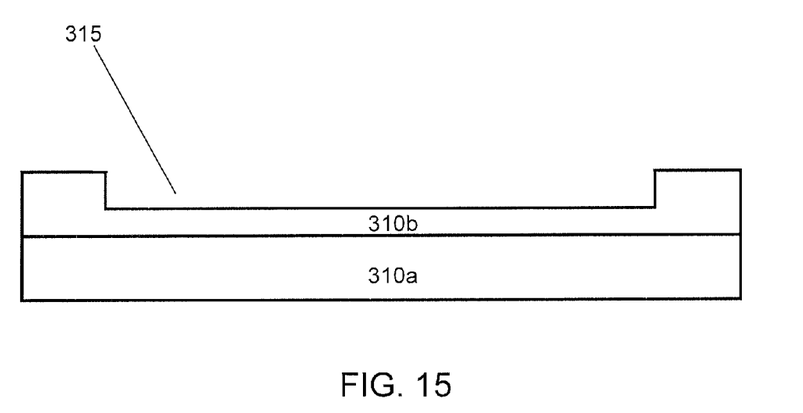

FIG. 15 shows the formation of a trench 315 in an exposed surface of the BOX layer 310b. The trench 315 may be formed using conventional semiconductor fabrication techniques, such as etching the BOX layer 310b through a mask, as discussed above with regard to the divots 15 and the BOX layer 10b. Many modifications and variations of the trench 315 will be apparent to those of ordinary skill in the art without departing from the scope and spirit of the invention.

Figure 16:
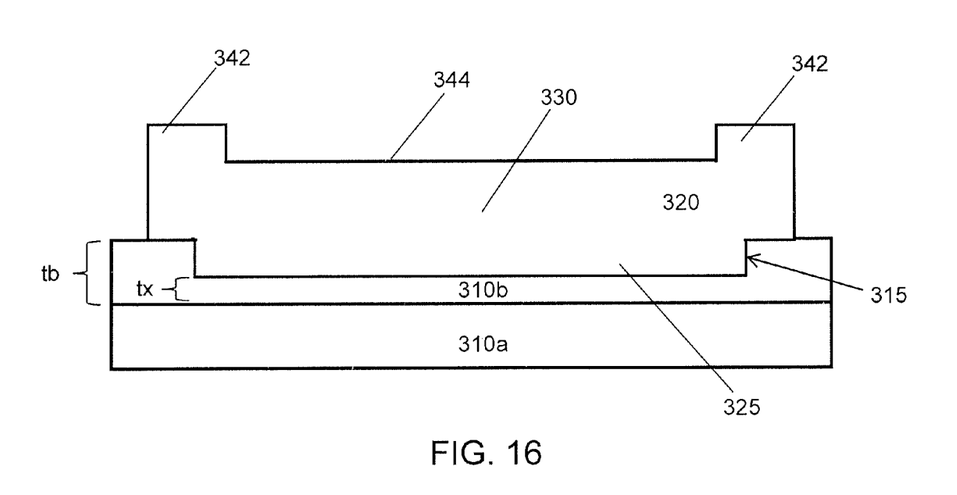

FIG. 16 shows a resistor 320 formed on the exposed surface of the BOX layer 310b. The resistor 320 may be formed in a similar manner as resistor 20 described with respect to FIG. 2, e.g., by conformal deposition of a polysilicon film and subsequent patterning of the film to define the resistor 320.

As depicted in FIG. 16, the resistor 320 includes an extension 325 that extends downward (e.g., vertically) into the trench 315 of the BOX layer 310b. As discussed above, in embodiments, the extension 325 provides an increased surface area for the resistor 320 that is outside of the central resistor portion 330. Consequently, a heat path from the resistor 320 to the substrate 310a through the BOX layer 310b is shorter because the thickness "tx" of the BOX layer 310b is decreased at portions of the BOX layer 310b below the extensions 325, as compared to the overall thickness "tb" of the BOX layer 310b. Thus, heat is capable of dissipating from the central portion 330 of the resistor 320 to the substrate 310a quicker along the shorter path.

Additionally, the trench 315 causes the formation of additional topographic structures 342 in the resistor 320. The topographic structures 342 impact the overall planarity of the resistor 320 formed over the top surface of the BOX layer 310b. In particular, a top surface 344 of the resistor 320 is caused to be non-planar.

Advantageously, the thermal resistance of the resistor 320 can be effectively lowered using the processes of the present invention. This is due to the increased surface area of the resistor 320 caused by the extension 325 and the shorter heat path to the substrate 320a caused by the decreased thickness "tx" of the BOX layer 310b. Consequently, the reduction in thermal resistance allows for the temperature of the resistor 320 to be decreased quicker.

Figure 17:
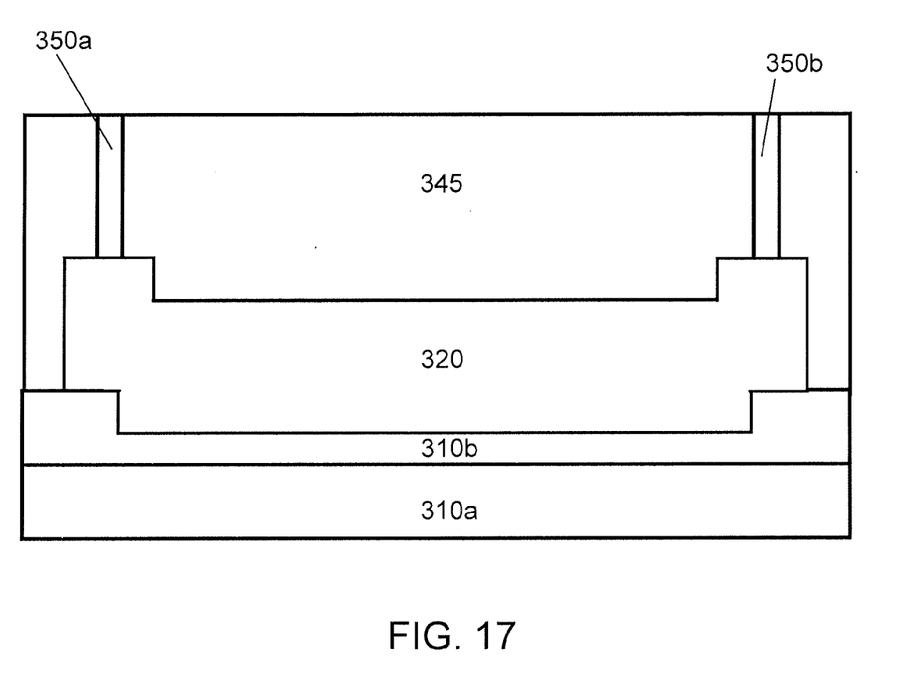

FIG. 17 shows the formation of an insulator layer 345 over the BOX layer 310b and the resistor 320, and the formation of contacts 350a and 350b in the insulator layer 345. The insulator layer 345 and the contacts 350a and 350b may be formed in a similar manner and composed of similar materials as the insulator layer 45 and the contacts 50a and 50b described above with regard to FIG. 5.

Figure 18:
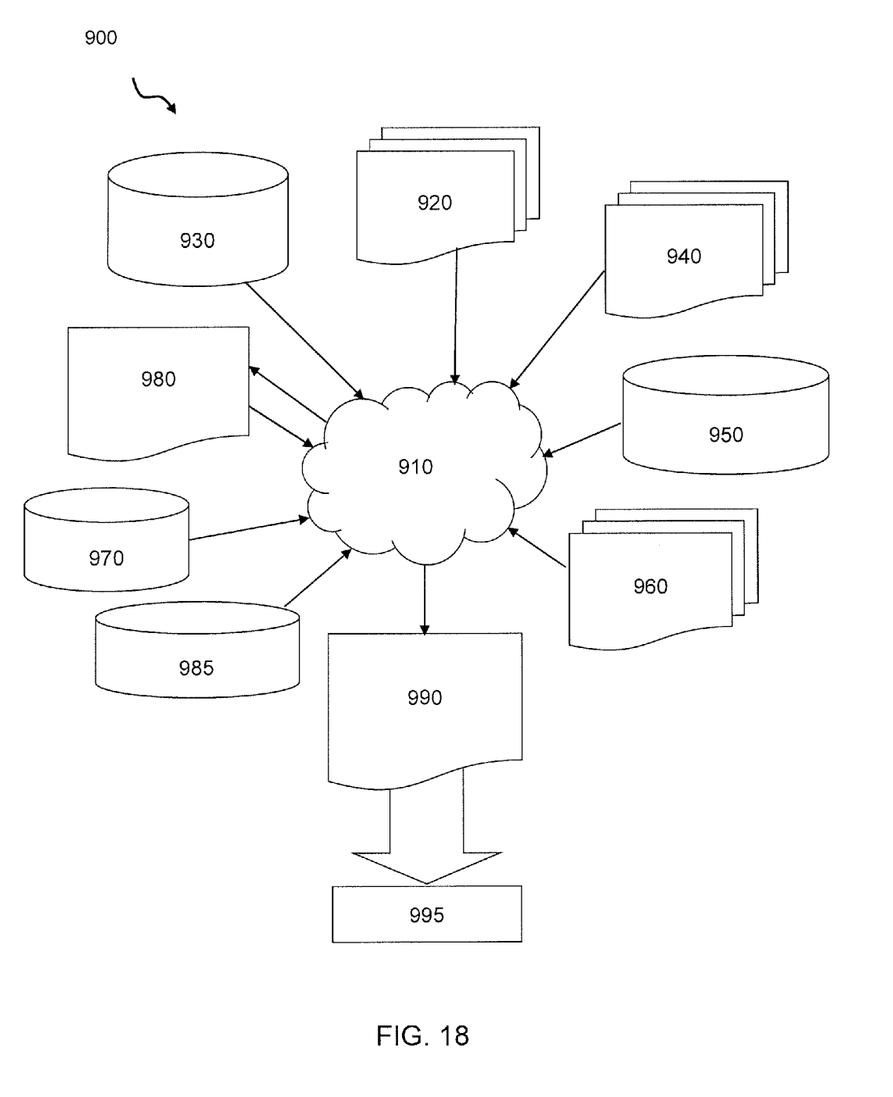
FIG. 18 is a flow diagram of a design process used in semiconductor design, manufacture, and/or test.

FIG. 18 is a flow diagram of a design process used in semiconductor design, manufacture, and/or test. FIG. 18 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-17. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-17. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-17 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-17. In one embodiment, design structure 990 may comprise a compiled, executable HDL simulation model that functionally simulates the devices shown in FIGS. 1-17.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-17. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a semiconductor structure, comprising:
    forming at least one trench in an insulator layer formed on a substrate, wherein a distance between a bottom edge of the at least one trench and a top surface of a substrate is shorter than a distance between an uppermost surface of the insulator layer and the top surface of the substrate;
    forming a resistor on the insulator layer and extending into the at least one trench;
    forming a first contact in contact with the resistor; and
    forming a second contact in contact with the resistor such that current is configured to flow from the first contact to the second contact through a central portion of the resistor,
    wherein the forming the at least one trench comprises forming a plurality of divots.

2. The method of claim 1, wherein:
    the substrate and the insulator layer are comprised in a silicon-on-insulator (SOI) wafer; and
    the forming the resistor comprises depositing a polysilicon film on the insulator layer and in the at least one trench.

3. The method of claim 1, further comprising forming each one of the plurality of divots with a width less than half a thickness of the resistor.

4. The method of claim 1, further comprising forming each one of the plurality of divots with a width that causes a top surface of the resistor to be substantially planar.

5. The method of claim 1, further comprising forming each one of the plurality of divots in the shape of a rectangle or square.

6. The method of claim 1, further comprising forming a liner on sidewalls of the plurality of divots.

7. The method of claim 6, wherein:
    the liner comprises a high thermal conductivity material; and
    a thickness of the liner is about 33% of a width of one of the plurality of divots.

8. The method of claim 1, wherein:
    the forming the at least one trench comprises forming two trenches with an island comprised of the insulator layer positioned between the two trenches; and
    the forming the resistor over the insulator layer forms a topographic structure in the resistor such that a top surface of the resistor is non-planar.

9. The method of claim 8, wherein the forming comprises etching only partially into the insulator layer.

10. A method of fabricating a semiconductor structure, comprising:
    forming a plurality of divots in an insulator layer formed on a substrate;
    forming a resistor on the insulator layer and filling the plurality of divots;
    forming another insulator layer over the resistor;
    forming a first contact in the other insulator layer and contacting a first end of the resistor;
    forming a second contact in the other insulator layer and contacting a second end of the resistor such that current is configured to flow from the first contact to the second contact through a central portion of the resistor; and
    sizing the plurality of divots in a top surface of the insulator layer such that a top surface of the resistor is substantially planar.

11. The method of claim 10, further comprising arranging the plurality of divots in the top surface of the insulator layer such that there is a denser population of divots in a center region of the top surface of the insulator layer and a sparser population of divots in edge regions of the top surface of the insulator layer.

12. The method of claim 10, further comprising forming a liner on sidewalls of the plurality of divots.

13. The method of claim 12, wherein:
    the liner comprises a high thermal conductivity material; and
    a thickness of the liner is about 33% of a width of one of the plurality of divots.

14. The method of claim 10, further comprising forming each one of the plurality of divots with a width less than half a vertical thickness of the resistor.

15. The method of claim 10, further comprising forming each one of the plurality of divots with a width that causes a top surface of the resistor to be substantially planar.

16. The method of claim 10, wherein:
    the substrate and the insulator layer are comprised in a silicon-on-insulator (SOI) wafer; and
    the forming the resistor comprises depositing a polysilicon film on the insulator layer and in the plurality of divots.

* * * * *